(12) United States Patent
Hirosaki et al.

(10) Patent No.: US 7,892,451 B2
(45) Date of Patent: Feb. 22, 2011

(54) PHOSPHOR

(75) Inventors: Naoto Hirosaki, Tsukuba (JP); Takayoshi Ezuhara, Tsukuba (JP); Susumu Miyazaki, Fujishiro (JP)

(73) Assignees: Sumitomo Chemical Company, Limited, Tokyo (JP); Independent Administrative Institution National Institute for Materials Science, Ibaraki (JP)

( * ) Notice: Subject to any disclaimer, the term of this patent is extended or adjusted under 35 U.S.C. 154(b) by 1081 days.

(21) Appl. No.: 11/578,783

(22) PCT Filed: Apr. 21, 2005

(86) PCT No.: PCT/JP2005/007601

§ 371 (c)(1),
(2), (4) Date: Oct. 18, 2006

(87) PCT Pub. No.: WO2005/103198

PCT Pub. Date: Nov. 3, 2005

(65) Prior Publication Data

US 2007/0210284 A1    Sep. 13, 2007

(30) Foreign Application Priority Data

Apr. 23, 2004  (JP) .............................. 2004-128630

(51) Int. Cl.
*C09K 11/02* (2006.01)
*C09K 11/77* (2006.01)

(52) U.S. Cl. .............................................. 252/301.4 R
(58) Field of Classification Search ........... 252/301.4 R
See application file for complete search history.

(56) References Cited

U.S. PATENT DOCUMENTS

| 7,267,786 B2 * | 9/2007 | Fiedler et al. ......... 252/301.4 F |
| 7,439,668 B2 * | 10/2008 | Setlur et al. ................. 313/503 |
| 2003/0032192 A1 | 2/2003 | Haubold et al. |

FOREIGN PATENT DOCUMENTS

| JP | 2001-214162 A | 8/2001 |
| JP | 2003-8082 A | 1/2003 |
| WO | 03/102113 A | 12/2003 |

OTHER PUBLICATIONS

Wuister. Efficient energy trnasfer between nanocrystalline YAG:Ce and TRITC. Phys. Chem. Chem. Phys., 2004, 6, 1633-1636.*
Yoshikatsu Oda, et al., "LED no Hakushokuka to soreni Kanshita Keikotai", Shikizai Kyokaishi, vol. 76, No. 11, Nov. 20, 2003, pp. 439-444.

* cited by examiner

*Primary Examiner*—C. Melissa Koslow
*Assistant Examiner*—Matthew E Hoban
(74) *Attorney, Agent, or Firm*—Sughrue Mion, PLLC

(57) ABSTRACT

Disclosed is a phosphor containing a nitrogen element, a compound having a garnet structure and an activator. The activator is composed of at least one element selected from the group consisting of Ce, Pr, Nd, Eu, Tb, Dy, Ho, Er, Tm, Yb and Mn.

4 Claims, 1 Drawing Sheet

PHOSPHOR

TECHNICAL FIELD

The present invention relates to a phosphor and a method for manufacturing the same.

BACKGROUND ART

A phosphor is used in a ultraviolet and visible light excited light-emitting device, such as a white LED; an electron beam excited light-emitting device, such as a CRT; an ultraviolet light-emitting device, such as a three-wavelength fluorescent lamp; a vacuum ultraviolet excited light-emitting device, such as a plasma display panel (hereafter abbreviated as "PDP"), a rare-gas lamp; and so on.

For example, a white LED is composed of a combination of a light emitting device that emits blue light, and a phosphor that is excited by the blue light and emits yellow light (including yellowish green and orange colors); and emits white light as an entire white LED by mixing the blue light and the yellow light. Since the wavelength range of the light emitted from the light emitting device that emits blue light is between 350 and 500 nm, as a phosphor that is excited by the light within the wavelength range and emits yellow light, an yttrium-aluminum-garnet phosphor ($Y_3Al_5O_{12}$:Ce), which as an oxide containing Y and Al has been heretofore used (for example, refer to Patent Document 1).

However, since the yellow light emitted from $Y_3Al_5O_{12}$:Ce (peak wavelength: around 527 nm) has a small amount of red component (580 to 700 nm) and is strongly greenish, when combined with a blue LED, there has been a problem wherein white light cannot be obtained; and a phosphor that is excited by the light emitted from a blue LED, whose light emitting peak is 540 nm to 560 nm, which is a longer wavelength than conventional wavelength, and has more red components has been demanded.

Patent Document 1: JP-A-2003-8082

DISCLOSURE OF THE INVENTION

Problem to be Solved by the Invention

It is an object of the present invention to provide a phosphor excited by the light of any wavelength within a wavelength range between 350 and 500 nm, and having the wavelength of the light emitting peak of 540 nm or longer and 560 nm or shorter; and a method for manufacturing the same.

Means for Solving the Problem

Therefore, under such a situation, the present inventors have exhaustively studied phosphors and methods for the manufacture thereof to solve the above-described problems, and found that a phosphor formed by adding an activator composed mainly of a rare-earth element to a compound having a garnet structure containing nitrogen atoms has a constant excitation intensity within a wavelength range between 350 and 500 nm, and a wavelength of the light emitting peak of 540 nm or longer and 560 nm or shorter, and thereby completed the present invention.

Specifically, the present invention provides a phosphor containing a nitrogen element, a compound having a garnet structure, and an activator wherein the activator is at least one element selected from the group consisting of Ce, Pr, Nd, Eu, Tb, Dy, Ho, Er, Tm, Yb and Mn. The present invention also provides a method for manufacturing a phosphor comprising calcining a mixture of metal compounds, which is to turn into a phosphor containing nitrogen element and a compound having a garnet structure by calcination or a phosphor containing an oxide having a garnet structure, in a nitrogen containing gas atmosphere within a pressure range of 0.2 MPa or more and 100 MPa or less, at a temperature range of 1000° C. or higher and 2400° C. or lower.

ADVANTAGES OF THE INVENTION

Since the phosphor of the present invention is efficiently excited by the light with a wavelength of from 350 to 500 nm emitted by a blue light-emitting device, emits a visible light, and can manufacture a white LED that emits pure white color by combination with a blue LED, the present invention is industrially highly useful.

BEST MODE FOR CARRYING OUT THE INVENTION

Figure 1:
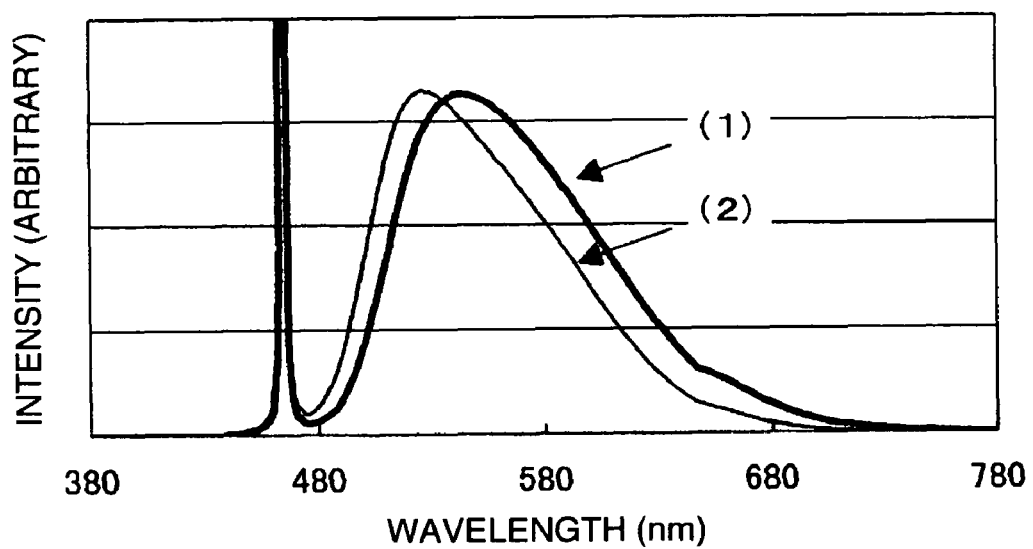
FIG. 1 shows a photoluminescence spectrum of a phosphor before heating treatment (wavelength of exciting light: 465 nm).

The present invention will be described in detail below.

The phosphor of the present invention contains a nitrogen element, a compound having a garnet structure, and an activator composed of a rare-earth element. The compound having a garnet structure is a compound having the same shape of crystal structure as the crystal structure represented by garnet (in formula $A_3B_2(SiO_4)_3$, A is at least one divalent metal ion selected from the group consisting of Ca, Mg and Fe; and B is at least one trivalent metal ion selected from the group consisting of Al, Fe and Cr).

The phosphor of the present invention contains at least one rare-earth element as an activator Ln. The rare-earth element is at least one element selected from the group consisting of Ce, Pr, Nd, Eu, Tb, Dy, Ho, Er, Tm, Yb and Mn. Metal elements that can be contained other than the activator may include at least one metal element selected from the group consisting of group 1 of the periodic table (Li, Na, K, Rb), group 2 (Be, Mg, Ca, Sr, Ba), group 3 (Sc, Y), group 4 (Ti, Zr, Hf), group 13 (B, Al, Ga, In), group 14 (Ge, Sn) and group 15 (Sb, Bi) (a total of 22 metal elements) (here, boron (B) is also included in metal elements for the sake of convenience).

Among phosphors having garnet structures, the phosphor composed of a compound represented by formula (1) containing an activator Ln is preferable.

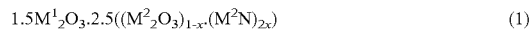

$$1.5M^1_2O_3 \cdot 2.5((M^2_2O_3)_{1-x} \cdot (M^2N)_{2x}) \qquad (1)$$

(where $M^1$ is at least one element selected from the group consisting of Y, Lu, Sc, La, Gd and Sm; and $M^2$ is at least one element selected from the group consisting of Al, Ga and In; and x is larger than 0 and 0.6 or less). Here, Y is preferable as $M^1$, and Al is preferable as $M^2$.

In the above-described formula (1), x corresponds to the quantity of nitrogen element, and the range of x is larger than 0 and 0.6 or smaller, preferably larger than 0 and 0.4 or smaller, and more preferably larger than 0 and 0.3 or smaller.

Furthermore, the activator Ln is preferably at least one element selected from the group consisting of Ce, Pr, Eu, Tb and Dy; more preferably Ce. In the phosphor of the present invention, nitrogen atoms are present in the crystal lattices of the compound having a garnet structure and/or between the crystal lattices, and contained in the phosphor.

The phosphor of the present invention is not required to be evenly distributed in entire particles containing the phosphor of the present invention, but it can be diffused and/or localized on the surface of and/or inside the particles, and particularly, an oxide having a garnet crystalline structure and the phosphor of the present invention can be contained in a particle.

A method for manufacturing the phosphor of the present invention will be described below.

Although the phosphor of the present invention can be manufactured by the following manner, the manufacturing method is not limited thereto. The phosphor of the present invention may be manufactured by a first manufacturing method wherein a phosphor containing an oxide having a garnet structure is held and calcined in a nitrogen element-containing gas atmosphere within a pressure range of 0.2 MPa or more and 100 MPa or less, at a temperature range of 1000° C. or higher and 2400° C. or lower.

The phosphor of the present invention may also be manufactured by a second manufacturing method wherein a mixture of metal compounds, which is to turn into a phosphor containing nitrogen element and a compound having a garnet structure by calcination, is maintained and calcined in a nitrogen element-containing gas atmosphere within a pressure range of 0.2 MPa or more and 100 MPa or less, at a temperature range of 1000° C. or higher and 2400° C. or lower.

For example, when a phosphor composed of a compound represented by $Y_{2.88}Ce_{0.12}Al_5O_{11.85}N_{0.1}$ (the case wherein $M^1$ is Y, $M^2$ is Al, and x is 0.02 in formula (1)) is synthesized, yttrium oxide, aluminum oxide ($Al_2O_3$) and aluminum nitride (AlN) are weighed so that the mole ratio of the composing elements becomes Y:Ce:Al ($Al_2O_3$-derived):Al (AlN-derived)=2.88:0.12:4.9:0.1, mixed, and calcined under the above-described conditions of the second manufacturing method to manufacture the phosphor.

As the starting material in the first manufacturing method for manufacturing the phosphor of the present invention, a phosphor containing an oxide having a garnet structure as the crystalline structure may be used, and specifically, a conventional phosphor composed of $Y_3Al_5O_{12}$ containing Ce as an activator may be used. Usually, the starting material does not contain nitrogen element, and the nitrogen content thereof is not more than the detection limit of a total nitrogen analysis and measurement instrument described below.

As the starting material in the second manufacturing method for manufacturing the phosphor of the present invention, a material that is easily decomposed to form an oxide at a high temperature, such as hydroxides, carbonates, nitrates, halides, and oxalates of high purity (99% or higher); oxides of high purity (99.9% or higher); or nitrides of high purity (99.9% or higher) may be used. Although AlN, GaN, InN, BN or azides may be used as the nitride, those having high purity (99.9% or higher) are preferable.

For mixing the starting materials, ball mills, V-shaped mixers, or agitators normally used industrially may be used.

In the first manufacturing method, a phosphor containing an oxide having a garnet structure as the crystalline structure is calcined; and in the second manufacturing method, the above-described mixture is calcined. In either manufacturing method, calcination is carried out by holding the above-described phosphor or mixture for example, within a temperature range of 1000° C. or higher and 2400° C. or lower, and a pressure range of 0.2 MPa or higher and 100 MPa or lower for 1 to 100 hours. The range of the calcination temperature is preferably 1500° C. or higher and 2200° C. or lower. The pressure of the atmosphere for calcination is preferably within a range of 2 MPa or higher and 70 MPa or lower.

When a material that can be decomposed at a high temperature to form an oxide, such as hydroxides, carbonates, nitrates, halides and oxalates, is used as a metal compound to be the starting material, it may be pre-calcined at a temperature range of for example 600° C. to 900° C. before calcination. By pre-calcination, the residual quantity of carbon component derived from the starting material, which is considered to cause the lowering of light-emitting characteristics, can be reduced, and the reactivity can be improved.

As the atmosphere for calcination in either first or second manufacturing method, an atmosphere containing nitrogen element is used. As the atmosphere containing nitrogen element, specifically, an atmosphere containing nitrogen and/or ammonia may be used, and in addition, the atmosphere can contain an inert gas, such as argon and helium. The content of nitrogen and/or ammonia is preferably 10% by volume or more, more preferably 50% by volume or more, further preferably 100% by volume, and most preferably, the atmosphere containing nitrogen element is composed of high-purity nitrogen (purity: 99.99% or higher) and/or high-purity ammonia (purity: 99.99% or higher).

The atmosphere for calcination is not specifically limited, but can be any inert-gas atmosphere, such as nitrogen and argon; an oxidizing atmosphere, such as air, oxygen, oxygen-containing nitrogen and oxygen-containing argon; a reducing atmosphere, such as hydrogen-containing nitrogen and hydrogen-containing argon; and a nitrogen element-containing gas atmosphere. To accelerate reaction, an appropriate quantity of flux may also be added.

Since the calcination temperature is high and the calcination atmosphere is nitrogen, the furnace used for calcination is preferably an electric furnace of a metal resistance heating system or graphite resistance heating system, using carbon as the material for the high-temperature portion of the furnace.

The nitrogen content in the phosphor may be measured using, for example, a Total Nitrogen Analyzer (Model TN-110, manufactured by Dia Instruments Co., Ltd.). This instrument quantitatively determines nitrogen monoxide (NO) generated when 1 to 30 mg of the phosphor powder is mixed with flux, and heated in a pyrolysis furnace (maximum attainable temperature: 1100° C.) by chemical luminescence. The quantity of the nitrogen component is calculated using a calibration curve prepared based on a pyridine/toluene standard solution.

Furthermore, the phosphor obtained by the above-described method may be ground using a grinding machine used industrially, such as a ball mil, vibration mill, Atritor and jet mill. The phosphor may also be washed or classified. To enhance the crystallinity of the obtained phosphor, re-calcination may also be performed.

In the phosphor obtained as described above, the light-emitting peak wavelength is shifted to the longer wavelength side compared with conventional phosphors consisting of oxides having garnet structures, and the wavelength of the light-emitting peak is at 540 nm or longer and 560 nm or shorter, which is of deep yellow (less green component and more red component). In addition, since the peak wavelength of the excitation spectrum is within a range from 350 to 500 nm, and the phosphor is thus efficiently excited by the light within this wavelength range to emit a deep yellow, it is suited to a white LED.

As a light-emitting device that emits the light having a wavelength from 350 to 500 nm, which excites the phosphor, a light-emitting device composed of a nitride semiconductor is preferable. The nitride semiconductor has been known as a semiconductor material having band gaps from 1.95 eV (InN) to 6.19 eV (AlN), and theoretically, the emission of light having wavelengths from about 633 nm to 201 nm is possible (for example, refer to JP-A-11-191638). Further, the nitride semiconductor can change the light-emitting wavelengths by the ratio of constituting elements, and the peak of the light-emitting wavelength may be controlled, for example, within a range from 320 to 450 nm in the Ga—N system and within a range from 300 to 500 nm in the In—Al—Ga—N system. An example of a light-emitting device composed of a nitride semiconductor is a light-emitting device having a hetero structure or a double-hetero structure, whose light-emitting layer is composed of a compound represented by a composition formula $In_xAl_yGa_{1-x-y}N$ (0<x, 0<y, x+y<1).

The white LED of the present invention may be manufactured using the phosphor of the present invention by heretofore known methods, such as those disclosed in JP-A-5-152609 and JP-A-7-99345. Specifically, the phosphor of the present invention is dispersed in a translucent resin, such as an epoxy resin, polycarbonate and silicone rubber, the resin having the phosphor dispersed therein is molded so as to surround a light-emitting device (compound semiconductor) on a stem to manufacture the white LED of the present invention. In the white LED of the present invention, although a blue light emitting nitride semiconductor is preferable as the light-emitting device, a compound semiconductor that emits ultraviolet to blue light may also be used.

Although the phosphor of the present invention may be used alone, by combining the phosphor with other phosphors, such as a phosphor that emits red light and a phosphor that emits green light, a white LED having higher whiteness may also be manufactured.

EXAMPLES

Next, the present invention will be described in further detail referring to examples; however, the present invention is not limited to these examples.

Photoluminescence spectrum was measured using a fluorescent spectrophotometer (SPEX FLUOROLOG manufactured by JOBIN YVON) by exciting with blue light of 465 nm.

The obtained phosphor was applied onto a blue light emitting device composed of a nitride semiconductor to make the phosphor emit light, the mixed color of the light from the nitride semiconductor and the light from the phosphor was deemed as the coloring of the LED, and the color was visually determined.

The nitride semiconductor having a composition of $In_{0.2}Ga_{0.8}N$ in the light emitting layer, and having light emitting peak at 465 nm was used. The nitride semiconductor was manufactured on a cleaned sapphire substrate by the MOVPE (metal organic vapor phase epitaxy) method using TMG (trimethyl gallium) gas, TEG (triethyl gallium) gas, TMI (trimethyl indium) gas, ammonia and a dopant gas (silane ($SiH_4$) and cyclopentadienyl magnesium ($Cp_2MG$)). The nitride semiconductor was provided with electrodes to make a light-emitting device.

Example 1

As a starting material, 2 g of powdery $Y_3Al_5O_{12}$:Ce (($Y_{0.96}Ce_{0.04})_3Al_5O_{12}$) was fed in a crucible made of boron nitride, and this was set in an electric furnace of a graphite resistance heating system (Himulti 5000, manufactured by Fuji Dempa Kogyou Co., Ltd.). The calcination atmosphere was evacuated using a diffusion pump, heated from room temperature to 800° C. at a rate of 500° C. per hour, nitrogen of a purity of 99.999% by volume was introduced at 800° C., and the pressure was elevated to 1 MPa (10 atmospheres). Then, the temperature was elevated at 500° C. per hour to 1800° C., maintained at 1800° C. for 4 hours, and gradually cooled to obtain 1.95 g of deep-yellow solid. By X-ray diffraction analysis, the crystalline structure was determined to be a garnet structure. The peak wavelength of the photoluminescence spectrum was 545 nm. FIG. 1 (1) shows the photoluminescence spectrum. Compared with comparative examples, deep yellow was emitted with less green component and more red component, and the coloring of the white LED fabricated using this was pure white.

The nitrogen content of the obtained powder was 0.03% by weight. If it is assumed that all the nitrogen is incorporated in the crystal lattice of YAG:Ce, the compound is represented by $(Y_{0.96}Ce_{0.04})_3Al_5O_{11.98}N_{0.01285}$ (x=0.00257).

Comparative Example 1

The peak wavelength of the photoluminescence spectrum of the starting material of Example 1, $Y_3Al_5O_{12}$:Ce, was 527 nm. FIG. 1 (2) shows the photoluminescence spectrum. Because of yellow photoluminescence with a relatively rich green component, the coloring as an LED was slightly bluish white.

Comparative Example 2

The starting material of Example 1, $Y_3Al_5O_{12}$:Ce, was calcined in a nitrogen atmosphere of a pressure of 0.1 MPa (1 atmosphere) at 1000° C. for 4 hours to obtain a yellow solid. The peak wavelength of the photoluminescence spectrum was 527 nm, which was the same as in the starting material. No nitrogen element was detected from the solid.

The invention claimed is:

1. A phosphor comprising a nitrogen element, a compound having a garnet structure, and an activator, wherein said compound having a garnet structure is a compound represented by the formula $1.5M^1{}_2O_3.2.5((M^2{}_2O_3)_{1-x}.(M^2N)_{2x})$, wherein $M^1$ is at least one selected from the group consisting of Y, Lu, Sc, La, Gd and Sm; $M^2$ is at least one selected from the group consisting of Al, Ga and In; and x is larger than 0 and 0.6 or less, and said activator is at least one element selected from the group consisting of Ce, Pr, Nd, Eu, Tb, Dy, Ho, Er, Tm, Yb and Mn.

2. The phosphor according to claim 1, wherein said activator is at least one selected from the group consisting of Ce, Pr, Eu, Tb and Dy.

3. The phosphor according to claim 2, wherein said activator is Ce.

4. A white LED comprising the phosphor according to any one of claims 1, 2 and 3.

* * * * *